US007529280B2

(12) United States Patent
Kelly et al.

(10) Patent No.: US 7,529,280 B2
(45) Date of Patent: May 5, 2009

(54) TUNABLE LASER APPARATUS AND METHODS

(75) Inventors: Conor Kelly, Corvallis, OR (US); Charles E. Otis, Corvallis, OR (US); Alexander Govyadinov, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 88 days.

(21) Appl. No.: 11/413,945

(22) Filed: Apr. 28, 2006

(65) Prior Publication Data
US 2007/0253452 A1    Nov. 1, 2007

(51) Int. Cl.
*H01S 3/10* (2006.01)
(52) U.S. Cl. .................. 372/20; 372/23; 372/26; 372/28
(58) Field of Classification Search .......... 372/20, 372/23, 26, 28
See application file for complete search history.

(56) References Cited

U.S. PATENT DOCUMENTS

| 4,881,231 A | * | 11/1989 | Jain .................... 372/32 |
| 4,982,405 A | * | 1/1991 | Zayhowski et al. ....... 372/10 |
| 5,291,502 A | | 3/1994 | Pezeshki et al. |
| 5,331,651 A | * | 7/1994 | Becker et al. ............ 372/32 |
| 5,648,160 A | * | 7/1997 | Kishimoto et al. ........ 428/328 |
| 6,154,471 A | * | 11/2000 | Jin et al. ................. 372/20 |
| 6,339,603 B1 | * | 1/2002 | Flanders et al. .......... 372/20 |
| 2002/0176473 A1 | | 11/2002 | Mooradian |
| 2003/0058902 A1 | | 3/2003 | Yuen |
| 2005/0105565 A1 | | 5/2005 | Tobiason et al. |

OTHER PUBLICATIONS

Li M.Y et al., "High Performance continuously Tunable Top-Emitting Vertical Cavity Laser with 20 NM Wavelength Range" Electronics Letters, IEE Stevenage, GB, vol. 33, No. 12, Jun. 5, 1997, pp. 1051-1052, XP000727062 ISSN: 0013-5194.
Sugihwo et al., "Low Threshold Continously Tunable Vertical-Cavity Surface-Emitting Lasers with 19.1 NM Wavelength Range" Applied Physics Letters, AIP, American Institute of Physics, Melville,NY US, vol. 70, No. 5, Feb. 3, 1997 pp. 547-549, XP000685256.
PCT International Search Report and Written Opinion for Application No. PCT/US2007/067470 mailed on Dec. 6, 2007. (14 pages).

* cited by examiner

*Primary Examiner*—Minsun Harvey
*Assistant Examiner*—Kinam Park

(57) ABSTRACT

A tunable laser has a first optical element spaced apart from a second optical element to form a laser cavity of fixed length there between. An optical gain medium is in at least part of the laser cavity A third optical element is selectively spaced apart from and facing the first optical element or is selectively spaced apart from and facing the second optical element.

20 Claims, 6 Drawing Sheets

TUNABLE LASER APPARATUS AND METHODS

BACKGROUND

In optical systems, it is desirable to generate light with good spectral purity, broad wavelength range, and saturation (control of illumination intensity) using a minimum amount of power and having a compact size. Many current technologies are available, such as incandescent, arc-discharge, light emitting diodes, and lasers. However, each of these technologies suffers in that they are incompatible with at least one of the desirable properties listed above.

Incandescent sources having wavelength filters have been used for generating a broad range of wavelengths with good spectral purity. Notwithstanding, these incandescent sources are undesirable in that they consume relatively large amounts of power and generate a substantial amount of heat. Also, control of saturation at a particular wavelength is difficult because when an incandescent source is dimmed, the amount of blue light generated decreases relative to the red light generated. The opposite effect occurs when the brightness of an incandescent source increases. An incandescent source is often driven at a constant temperature and light modulators are used to achieve the desired intensity control, otherwise known as saturation or gray level. Although the incandescent light source with a modulator works in many applications, there is an undesirable bulk and complexity associated with the combination of the light source and the modulator when used in a product. Furthermore, there is a need to dissipate a large amount of heat generated from an incandescent source. Dissipating a large amount of heat makes a compact source unfeasible, which limits usefulness of this incandescent source.

Arc-discharge sources consume less power than incandescent sources, however the problem of heat dissipation still remains. Therefore, there is a limit to broad product application of an arc-discharge source. The arc-discharge source suffers from all the aforementioned problems of an incandescent source, except the power consumption is less. Also, since the power spectrum of an arc-discharge source is not uniform, many desired wavelengths may not be generated. Furthermore, the arc-discharge source requires a high voltage to strike the arc. This high voltage requirement adds further complexity and bulkiness. Therefore, it is unlikely that a compact source will use an arc-discharge source.

Light emitting diodes have good spectral purity, relatively easy control of saturation, low power consumption, and a compact size. However, the wavelength of emitted light is fixed and not broadly adjustable. The fixed wavelength occurs because the output of each individual light emitting diode is determined by the material used to make the light emitting diode. Since wavelength is specific to a particular material, it cannot be used to produce light over a broad range of wavelengths. Therefore an individual light emitting diode cannot support a broad range of wavelengths.

Lasers have very good spectral purity and an extremely high radiance (energy per area per solid angle) which is unattainable by other light sources. However, a tunable laser having a broad wavelength range, good saturation control and compact size has yet to been developed.

In order to enable a broad range of product applications, an optical source having the desirable optical properties of good spectral purity, tunability over a broad wavelength range, good control of saturation, and/or compact size would be useful. This optical source may, for example, enable applications in: Display technologies such as personal projectors and near eye displays; health and wellness testing systems based on optical techniques such as spectrum analysis of assays; home and commercial offices such as printers for printing and imaging of documents and pictures; optical network and communication systems such as modulators. Furthermore, each of these applications can be made portable by using a compact source of light with the above mentioned properties.

Therefore, there is a need for a compact optical source having good spectral purity, tunability, and/or control of saturation.

BRIEF DESCRIPTION OF THE DRAWINGS

The exemplary embodiments of an optical system are better understood with reference to the following drawings. The elements of the drawings are not necessarily to scale relative to each other; rather, emphasis has instead been placed upon clearly illustrating the embodiments of the optical system. Furthermore, like reference numerals designate corresponding similar parts through the several views.

DETAILED DESCRIPTION

The exemplary embodiments of an optical system are directed to apparatuses and adjustment methods for tuning at least one laser. The exemplary implementations may, for example, enable applications in printing and imaging, projection displays, analytical analysis, optical communications and the like. Furthermore, an optical system can be formed from one or more tunable micro-lasers. The use of one or more tunable micro-lasers enables compact optical systems and optical systems of compact size.

Figure 1:
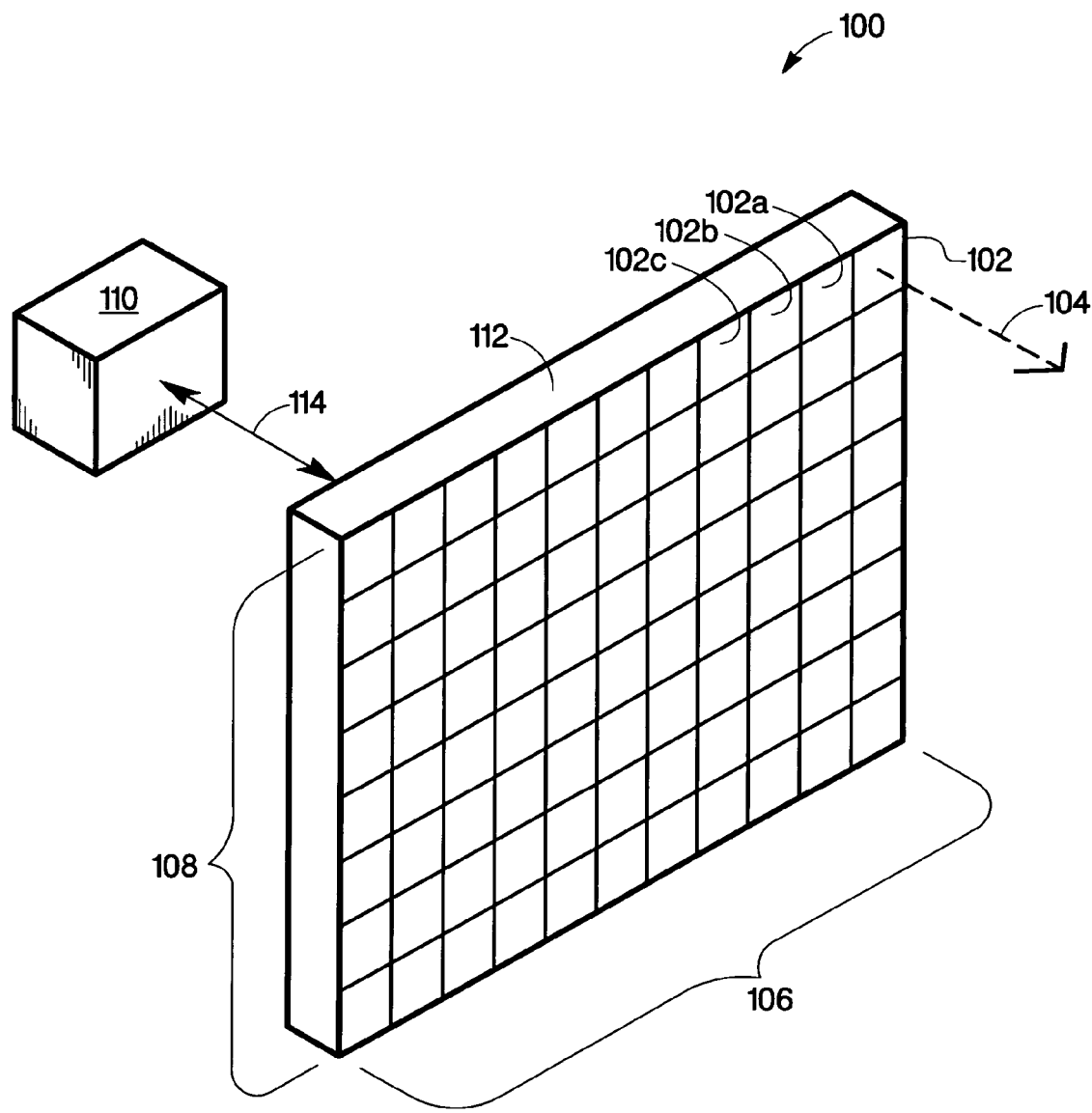
FIG. 1 shows an illustrative diagram of an image projection system having a controller and a matrix of tunable lasers according to an exemplary embodiment of an optical system.

FIG. 1 shows a illustrative diagram of an image projection system 100 having a controller 110 and a plurality of tunable lasers 102, according to an exemplary embodiment of an optical system. The plurality of tunable lasers 102 may be arranged in a variety of configurations. In this example, a matrix of tunable lasers 112 is formed by arranging tunable lasers 102 in rows 108 and columns 106. The individual tunable lasers 102 can be arranged side by side as shown by 102*a*, 102*b*, 102*c*, and the like. Each tunable individual laser 102 is shown to be approximately square, although each tunable laser 102 can also be rectangular, circular, hexagonal, triangular, or any other desirable shape either individually or in combination. Each individual tunable laser 102 is independently tuned by a matrix controller 110 operatively coupled to the matrix of lasers 112 by an interface 114. Each tunable laser 102 selectively outputs laser light 104 of a specific wavelength according to the controller 110. The wavelength of the laser light 104 can range from deep ultraviolet to deep infrared depending on the capability of the tunable laser 102. The matrix controller 110 can address individual tunable lasers 102 according to a row and column decoder (not shown). The row and column decoder may function in a fashion similar to an active matrix display, whereby the wavelength of laser light 104 of the tunable laser 102 is established by placing a voltage on a particular column 106 while a particular row 108 is addressed. The voltage may be held in a memory device, for example, a capacitor (not shown) for the purpose of retaining the state of the wavelength of a particular tunable laser 102. Hence, the selected wavelength of laser light 104 may be substantially constant during this state (or for period of time) and therefore create persistence of laser light 104 until a new state is commanded from the matrix controller 110 (or the period of time elapses). Operating the tunable laser 102 in this manner selectively changes the wavelength of the laser light 104 produced by the tunable laser 102, and may be referred to as wavelength modulation or frequency modulation.

In some instances, rather than requiring each individual laser to be tunable to render a variety of wavelengths, it may be desirable to have each individual tunable laser 102 dedicated to render a specific wavelength; for example red, green, or blue. In this situation, the tunable feature of the tunable laser 102 may be used to rapidly switch the laser light 104 on and off to render an average intensity level for a particular color. Rapidly switching the laser light 104 on and off to change the average intensity of the laser light 104 can be a form of amplitude modulation. Changing the average intensity may also be referred to as changing the saturation level, or changing the gray level.

As an example; red, green, and blue tuned lasers can be placed next to each other, for instance 102*a*, 102*b*, and 102*c* respectively. This group or other like groups of lasers can project a combined beam of laser light capable of generating a wide gamut of perceived colors.

In order to turn an individual tunable laser 102 on and off, the tunable laser may be tuned outside of a wavelength supported by the tunable laser 102. For example, a tunable laser 102 could be adjusted from red to infrared wavelengths or from blue to ultraviolet wavelengths. If a tunable laser cannot establish lasing action at these infrared or ultraviolet wavelengths, there will be no emitted laser light 104. In other words, the tunable laser is essentially turned off by tuning the wavelength outside of a band supported by the tunable laser 102. Turning the laser on and off in this fashion is a type of amplitude modulation. As will be described in the embodiments of an optical system, for small tunable lasers 102, tuning can be accomplished very quickly, e.g., on the order of microseconds.

It is not necessary to create a matrix of tunable lasers 112. Individual tunable lasers 102 may be formed into a variety of shapes and placed in a desired orientation or pattern. For instance, a single row 108 or alternately, a single column 106 of tunable lasers 102 may form an array. Arrays of tunable lasers 102 may be less expensive to fabricate than a matrix of tunable lasers 112. Arrays of tunable lasers 102 may find application in optical spectroscopy, printing, imaging, optical communication and the like.

Figure 2:
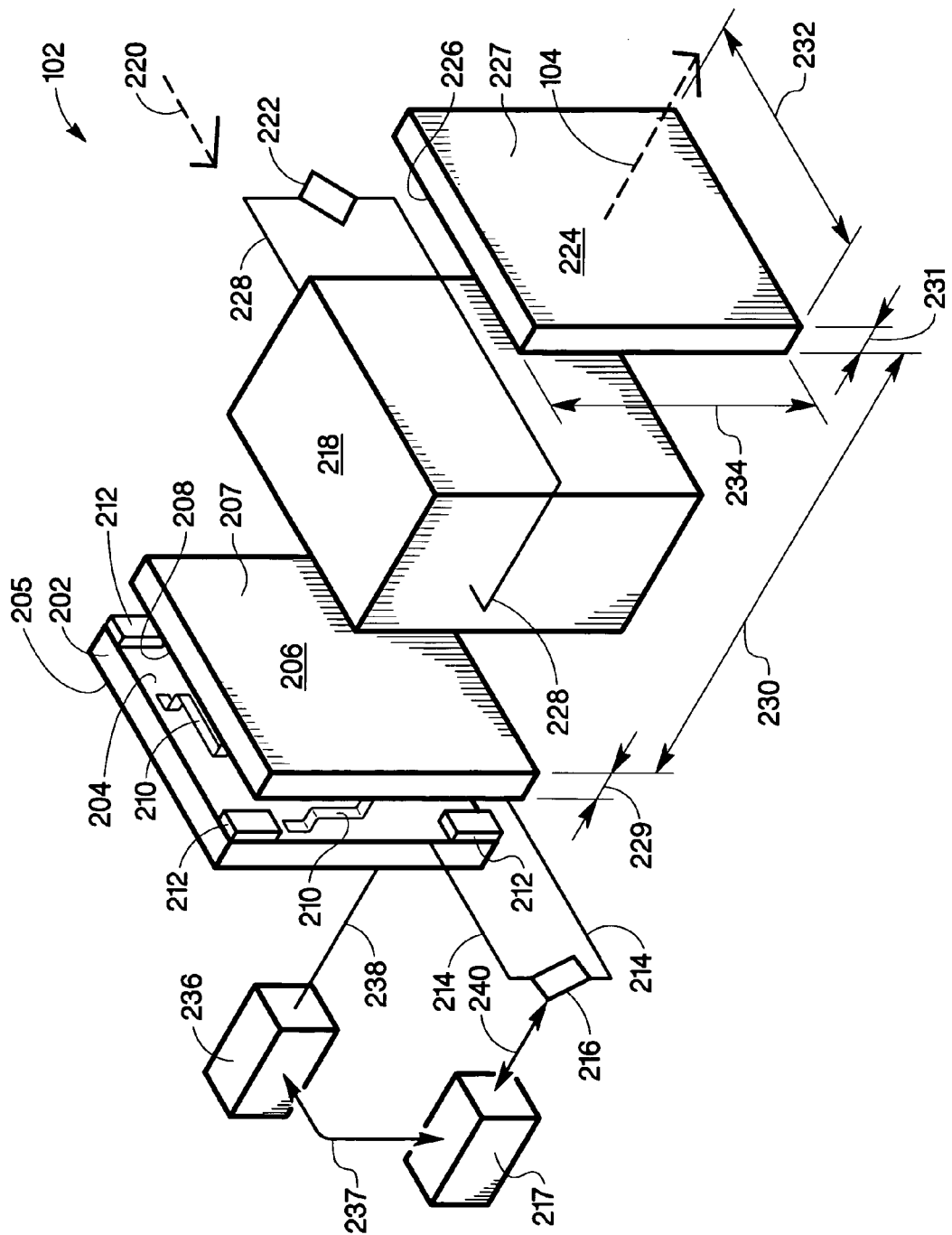
FIG. 2 shows an illustrative diagram of a tunable laser having optical elements, a movable optical element, an actuator, an optical gain medium, and a controller according to an exemplary embodiment of an optical system.

FIG. 2 shows an illustrative diagram of a tunable laser 102 as shown in FIG. 1 according to an exemplary embodiment of an optical system. The tunable laser 102 has a first optical element 224 facing and spaced a fixed length 230 apart from a second optical element 206. The first optical element 224 and the second optical element 206 have a height 234 and depth 232 to produce a laser cavity 235 (see FIG. 3) which is defined by the fixed length 230, the height 234, and the depth 232. An optical gain medium 218 is placed at least partially between the first 224 and second 206 optical elements. Other layers or materials may be placed between or upon the first 224 and second 206 optical elements. For example, compensation coatings may be used to enhance the spectral response of the tunable laser 102. The compensation coatings may be placed over the first surface of the second optical element 207, the first surface of the first optical element 226, over or between other surfaces of optical components including the gain medium 218 or the like. The compensation coatings may be formed from oxides, nitrides, carbides, or the like.

If the optical gain medium 218 is a gas or a liquid, a containment vessel may house the optical gain medium 218. The containment vessel may be relatively large and planar; for example, two pieces of optical glass or other optical material spaced apart from each other, filled with a gas or liquid lasing medium, and sealed at the perimeter. The pieces of glass may be precisely spaced apart by spacers. The spacers may be formed into the glass or placed between the glass plates in locations for instance around the perimeter of each tunable laser 102 so as not to interfere with the laser light 104 output. The pieces of glass may be used to form a substrate upon which to deposit the first 224 and second 206 optical elements.

The first 224 and second 206 optical elements are partially reflective. The first optical element 224 may be referred to as an output coupler. In certain embodiments, for example, the first optical element 224 may have a reflectance of about 80% or more and/or the second optical element 206 may have a reflectance of about 60% to about 95%. The reflection may occur, for example, from metal and made from alloys of tantalum and aluminum arranged on the first 224 and second 206 optical elements. The reflectance of the first optical element 224 along with the reflectance of the second optical element 206 affects the quality factor of a laser cavity. If reflectance from these two optical elements is high, both the coherence of the emitted laser light 104 is increased and less gain is required from the optical gain medium 218. However, if the reflectance of the first optical element 224 is too high, less laser light 104 will be emitted.

Those skilled in the art will recognize that reflective material may be applied to the first surface of the first optical element 226, the second surface of the first optical element 227, the first surface of the second optical element 207, the second surface of the second optical element 208, or combinations thereof. Compensation material may be placed over the reflective material to improve the bandwidth of the lasing system. The compensation material may be formed from oxides, nitrides, carbides, or the like.

The optical gain medium 218 may be a solid, liquid, a gas, or combinations thereof. Those of skill in the art are familiar with optical gain media. Examples of a solid optical gain media 218 are: gallium arsenide, yttrium aluminum garnet, yttrium lithium fluoride, ruby rod, titanium doped sapphire and the like. Examples of a liquid optical gain media 218 are: stilbene, coumarin, rhodamine, and the like. Examples of a gas optical gain media are: helium-neon, argon-ion, krypton-ion, xenon-ion, helium-selenium, and the like.

The optical gain medium 218 may be optically sourced 220, e.g., pumped from, for example, an ultraviolet, infrared, visible, or other type of optical radiation source. The optical gain medium 218 may be electrically sourced 222, e.g., pumped by operatively coupling an electrical source 222 to an optical gain medium 218 by electrical conductors 228. If the optical gain medium 218 is a gas, the pumping may be an electrical discharge. If the optical gain medium 218 is a semiconductor, the optical gain medium 218 may be pumped by an electrical current flowing through the semiconductor from the electrical source 222. The optical gain medium 218 may be optically sourced 220 and electrically sourced 222 at the same time.

Although the optical gain medium 218 is shown with the optical source 220 directed in a particular orientation, the optical source 220 may be directed in one or more different orientation(s). Also, if the optical gain medium is electrically sourced 222, the electrical conductors 228 may be placed on the optical gain medium 218 in other locations.

The laser cavity is formed between the first optical element 224 and second optical element 206 having dimensions of fixed length 230, depth 232, and height 234. Although rectangular shapes and dimensions associated with the rectangular shapes have been chosen to more easily illustrate the concepts associated with an embodiment of an optical system, the shapes and dimensions are not limited. Other shapes may be used such as circular, hexagonal, triangular, and rectangular, any combinations thereof, or the like.

The fixed length 230, depth 232, and height 234 dimensions define a resonant laser cavity that sustains the lasing action of the laser when pumped, e.g., sourced optically 220, sourced electrically 222, or in combination. In certain embodiments, the length 230 of the laser cavity extends from the partially reflective surfaces of the first surface of the first optical element 226 to the first surface of the second optical element 207. However, if the reflective surfaces of the optical elements were the second surface of the first optical element 227 and the second surface of the second optical element 208, then the laser cavity would extend further given the thickness of the first optical element 231 and the thickness of the second optical element 229.

Although the length 230 of the laser cavity is fixed, the wavelength of the generated laser light can be tuned by placing a movable third optical element 202 facing the second optical element 206 where the first surface of the third optical element 204 is facing the second surface of the second optical element 208.

A reflective coating is applied to either the first surface 204 of the third optical element 202, or on the second surface 205 of the third optical element 202. In certain embodiments, for example, the third optical element 202 is between about 60% and about 100% reflective. The reflective coating may be, for example, metal and made from alloys of tantalum and aluminum. The partially reflective second optical element 206 in combination with the third optical element 202 serves to form a tunable optical filter. By selectively moving the third optical element 202 closer to and further away from the second optical element 206, the wavelength of the tunable optical filter may be changed. This changing wavelength thereby changes the absorptive and reflective properties of the first surface 207 of the second optical element 206 which forms one of the surfaces of a laser cavity 235. The changing absorptive and reflective properties of the first surface of the second optical element 207 correspondingly changes (e.g., tunes) the wavelength of the resulting laser light 104.

The third optical element 202 can be moved using actuator 236 operatively coupled to the third optical element 202 by a coupler 238. The actuator 236 may be electrostatic, piezoelectric, thermal, mechanical, electromagnetic or any actuator capable of displacement of the third optical element 202. A controller 217 exchanges positional commands with the actuator 236 through an interface 237 operatively coupling the two. Therefore, the controller 217 can tune the wavelength of the laser light 104 by effecting the position of the third optical element 202 by actuator 236 and coupler 238. The wavelength of the tunable laser light 104 can be substantially tuned or substantially changed over a wide range of wavelengths and is determined by the spacing of the third optical element 202 to the second optical element 206. The range of tunability of the tunable laser 102 is large and is such that the wavelength for lasing can be outside of the wavelength supported by the gain medium 218 even if the gain medium is being continually sourced electrically 222, optically 220, or both. This wide range of tunability allows the tunable laser 102 to turn the laser light 104 off by tuning the tunable laser 102 outside of the wavelength supported by the gain medium 218 and turn the laser light 104 on by tuning the tunable laser 102 within the wavelength supported by the laser cavity 235 and/or the optical gain medium 218.

The third optical element 202 may be coupled to the second optical element 206 by flexure 210. The flexure 210 hold the movable third optical element 202 in a fixed position when no force is applied from an actuator 236 through coupler 238.

Another exemplary type of actuation will now be described. Electrostatic actuation of the position of the third optical element 202 with respect to the second optical element 206 occurs if a voltage is applied between electrically conductive metalized coatings of the second surface of the second optical element 208 and the first surface of the third optical element 204. The metalized coatings are operatively coupled to a source 216 by electrical conductors 214. Voltage from the source 216 develops a potential between the metalized coating 208 of the second optical element 206 and the metalized coating 204 of the third optical element 202. The potential causes an electrostatic force which is attractive, forcing the third optical element 202 against the restraining force of the flexure 210 until an equilibrium position is achieved, thereby selectively spacing the third optical element 202 apart from the second optical element 206. There may be one or more flexures 210.

The wavelength of the outputted laser light 104 is in direct response to spacing between the third optical element 202 and the second optical element 206. Therefore, the wavelength of the laser light 104 can be changed or tuned in a continuous fashion under control of the tunable laser controller 217 which is operatively coupled to the electrical voltage source 216 by interface 240. The continuous movement provides for a rendering of a broad range of wavelengths. For example the wavelengths may range from deep ultraviolet to deep infrared.

The wavelength of the laser light 104 can be abruptly changed under control of the tunable laser controller 217 by commanding a large voltage to the source 216 or a large positional change from actuator 236. If a large voltage is applied between the second optical element 206 and the third optical element 202, the third optical element 202 will move toward the second optical element 206 and settle on the stops 212. These stops 212 may be precision bumps and may be designed to selectively space apart the third optical element 202 from the second optical element 206 by an exact amount. The stops are shown mounted to the first surface of the third optical element 204, however the stops can also be mounted on the second surface of the second optical element 208 facing the first surface of the third optical element 204. The stops 212 by virtue of their precision, can be used to render a specific wavelength of laser light 104 from the tunable laser 102. Removing the applied voltage from the source 216 or setting the source voltage to zero causes the third optical element 202 to move into a neutral position such that the third optical element 202 is selectively spaced apart from the second optical element 206 by the flexure 210 thereby rendering another specific wavelength of laser light 104. The third optical element 202 can be moved rapidly and controllably between the precision stops and the neutral flexure position in a digital fashion controlled by the controller 217 and thereby effecting laser light output at two distinct wavelengths.

When a displacement of the third optical element 202 reaches a threshold very little to no laser light 104 is output. Movement of optical element 202 in this bi-modal operation can modulate the laser light 104 by rapidly turning it on and off without having to resort to external modulation techniques and additional system complexity such as micro-mirror arrays, liquid crystal shutters, anisotropic polarizers, and the like.

Figure 3:
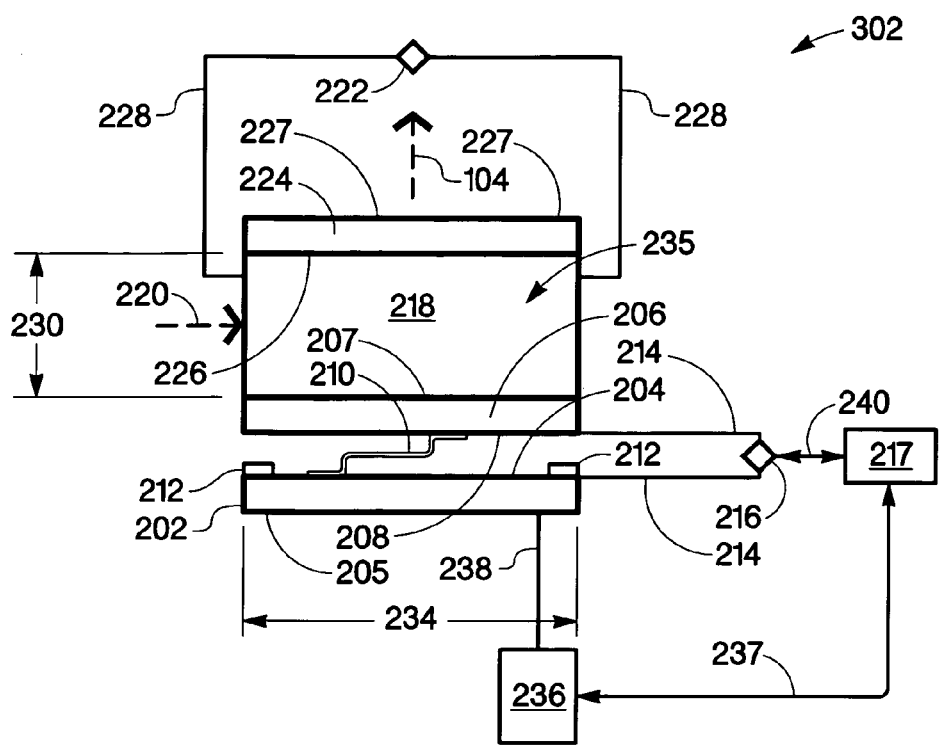
FIG. 3 shows an cross-sectional view of a tunable laser having optical elements, where some optical elements are in direct contact with an optical gain medium according to an exemplary embodiment of an optical system.

FIG. 3 shows an embodiment of a cross-sectional view of a tunable laser 302 according to an exemplary embodiment of an optical system. The operation of the tunable laser 302 is similar to the operation of the tunable laser 102 as previously shown in FIG. 2. The optical gain medium 218 may be placed in direct contact with the second optical element 206. The first optical element 224 may be in direct contact with the optical gain medium 218. This stack of layers shown in FIG. 3 may be formed by integrated circuit processes, micro-electrical-mechanical systems processes, chemical processes and the like.

As an example, the first optical element 224 may be a partially reflective optical element and serve as a substrate. An optical gain medium 218 may be deposited on the first surface of the first optical element 226 forming a solid-state gain medium layer. Then, a partially reflective second optical element 206 may be deposited on the optical gain medium 218. The fixed distance between the first surface of the first optical element 226 and the first surface of the second optical element 207 defines the fixed laser cavity length 230. Flexure 210 and a sacrificial layer (not shown) are deposited on the second optical element 206. The definition of the flexures and sacrificial layer are controlled by photo, masking, and etching processes. A third partially reflective optical element 202 is deposited over the flexure 210 and sacrificial layer (not shown). The third optical element 202 can be partially reflective or totally reflective. The sacrificial layer, e.g., the volume of material between the second optical element 206 and the third optical element 202 may be removed using a variety of etching methods, such as, but not limited to: a wet etch using potassium hydroxide; a gas etch using xenon diflouride; a plasma etch; a plasma assisted gas etch; and the like. After etching, the flexure 210 remains flexibly coupled between the second optical element 206 and the third optical element 202. By way of example, the flexure 210 may be made of a metal such as tantalum-aluminum or the like.

In certain embodiments, the third optical element 202 is movable by a coupler 238 coupled to an actuator 236 which is operatively coupled to a controller 217 through an interface 237. Selectively spacing the third optical element 202 from the second optical element 206 effects the wavelength of the laser light 104 and/or the ability of laser 302 to generate laser light 104.

In certain embodiments, an additional and/or other way to effect the movement of the third optical element is to electrically connect a source 216 to the second 206 and third 202 optical elements using electrical conductors 214. The source 216 is operatively coupled to a controller 217 by an interface 240. The solid state optical gain medium 218 can be excited (pumped) by an electrical source 222 which provides current to the optical gain medium through electrical conductors 228.

In other embodiments, the optical gain medium 218 may be a gas and/or a liquid. The gas and/or the liquid may be contained, for example, in an optically transparent cavity. An optically transparent cavity may be formed, for example, by two clear parallel pieces of glass separated by spacers filled with gas or liquid and sealed at the perimeter. A first 224 and a second 206 optical element may be placed by deposition, plating or other techniques on the optically clear cavity thereby forming a fixed length laser cavity 230. The gas and/or liquid may be excited or pumped by an optical source 220. The gas may be excited from an electrical discharge from an electrical source 222.

Figure 4:
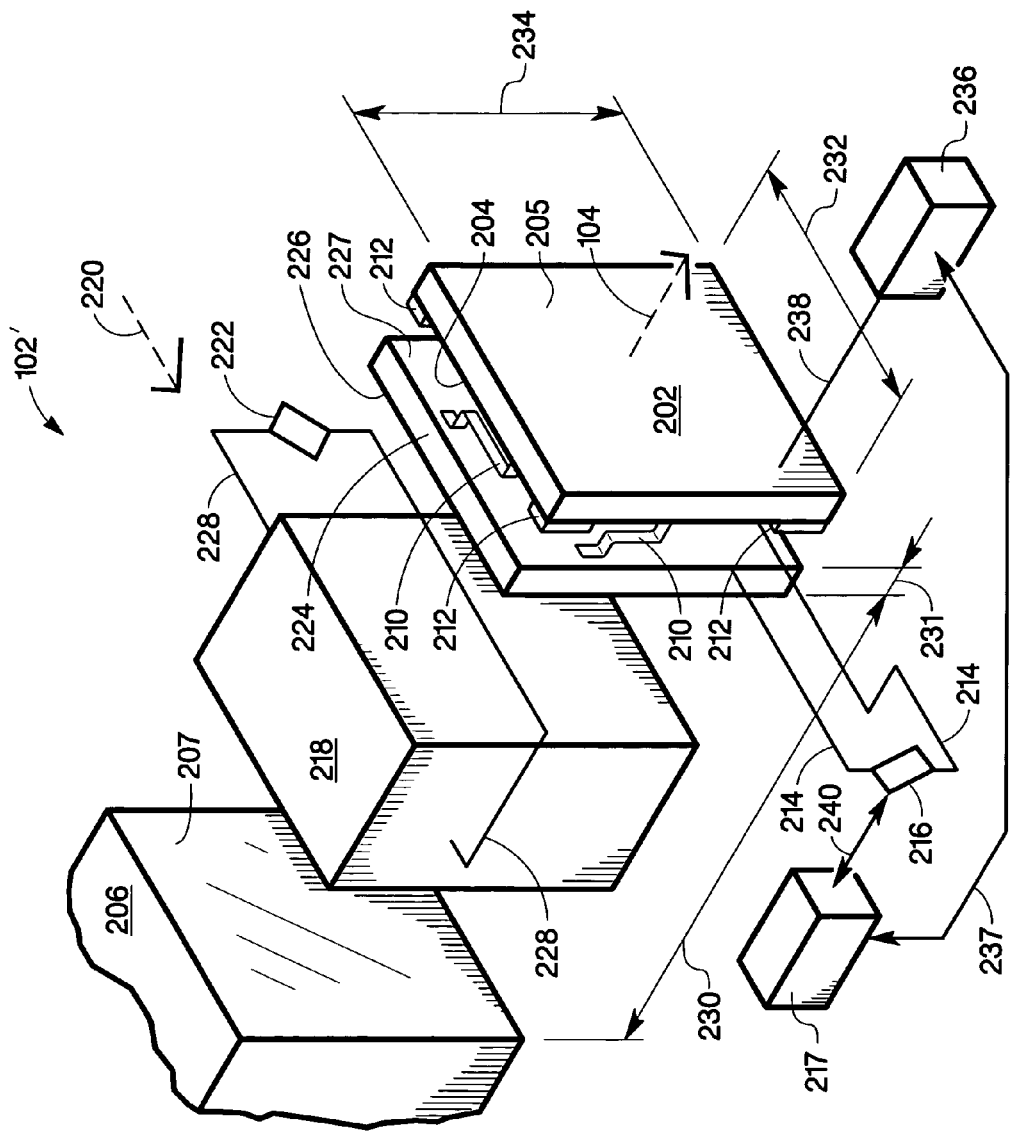
FIG. 4 shows an illustrative diagram of a tunable laser having optical elements, a movable optical element, an actuator, an optical gain medium, and a controller according to an exemplary embodiment of an optical system.

FIG. 4 shows a perspective view of a tunable laser 102' according to an exemplary embodiment of an optical system. The tunable laser 102' in FIG. 4 is similar to the tunable laser 102 FIG. 2, although there are some differences. The commonality between FIG. 4 and FIG. 2 will not be repeated, rather the differences will be described.

One difference is the tunable laser 102' in FIG. 4 has a third optical element 202 movably coupled to a first optical element 224 rather than having the third optical element 202 movably coupled to the second optical element 206 as shown in FIG. 2.

In FIG. 2, the third optical element 202 is selectively spaced apart and moveable with respect to the second optical element 206. As such, these two optical elements form an optical filter that modifies the spectral properties of the first surface of the second optical element 207. The changed spectral properties of the first surface of the second optical element 207 effects a change in the wavelength of the laser light 104. Therefore selectively spacing apart the third optical element 202 with respect to the second optical element 206 tunes the wavelength of laser light 104.

In FIG. 4, the third optical element 202 is selectively spaced apart and moveable with respect to the first optical element 224. As such, these two optical elements form an optical filter that modifies the spectral properties of the laser light 104 that passes through the first 224 and third 202 optical elements. The filter allows only a specific wavelength of laser light 104 to be emitted from the tunable laser 102' based on the distance between the first 224 and third 202 optical elements. Therefore selectively spacing apart the third optical element 202 with respect to the first optical element 226 tunes the wavelength of laser light 104.

In the example shown in FIG. 2, for the tunable laser 102, the first optical element 224 is partially reflective and has a reflectance of at least about 80%, the second optical element 206 is partially reflective and has a reflectance from about 60% to about 95%, and the third optical element 204 is partially reflective and has a reflectance from about 60% to about 100%. The laser light 104 is emitted from the partially reflective first optical element 224.

In the example shown in FIG. 4, for the tunable laser 102' the first optical element 206 is partially reflective and has a reflectance from about 60% to about 95%, the second optical element 206 is partially reflective and has a reflectance from about 60% to about 100%, and the third optical element 202 is partially reflective and has a reflectance at least about 80% reflective. The laser light 104 is emitted from the partially reflective third optical element 202.

Figure 5:
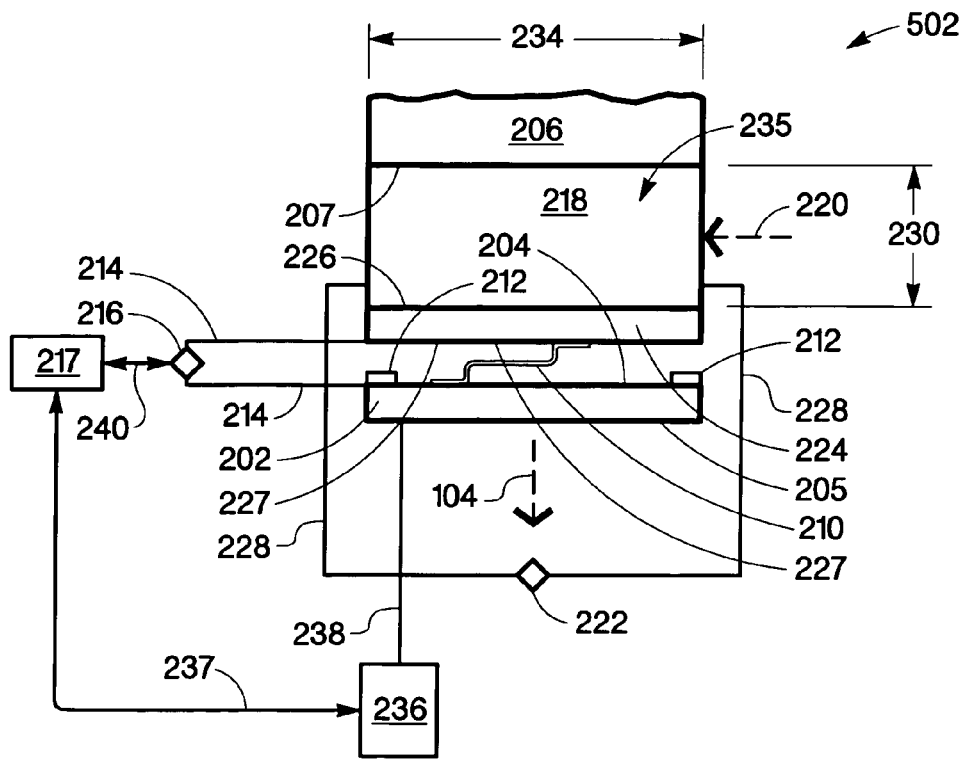
FIG. 5 shows a cross-sectional view of a tunable laser having optical elements, where some optical elements are in direct contact with an optical gain medium according to an exemplary embodiment of an optical system.

FIG. 5 shows a cross-sectional view of a tunable laser 502 according to an exemplary embodiment of an optical system.

The operation of the tunable laser 502 is similar to the operation of the tunable laser 102' as previously shown in FIG. 4. The optical gain medium 218 may be placed in direct contact with the second optical element 206. The first optical element 224 may be in direct contact with the optical gain medium 218. This stack of layers shown in FIG. 5 may be formed by integrated circuit processes, micro-electrical-mechanical systems processes, chemical processes or the like.

As an example, the second optical element 206 may be a partially reflective optical element and serve as a substrate. An optical gain medium 218 may be deposited on the first surface of the first optical element 207 forming a solid-state gain medium layer. Then, a partially reflective first optical element 224 may be deposited on the optical gain medium 218. The fixed distance between the first surface of the first optical element 226 and the first surface of the second optical element 207 defines the fixed laser cavity length 230. Flexure 210 and a sacrificial layer (not shown) are deposited on the first optical element 224. The definition of the flexure 210 and sacrificial layer can be controlled by photo, masking, and etching processes. A third partially reflective optical element 202 is deposited over the flexure 210 and sacrificial layer (not shown). The third optical element 202 is partially reflective. The sacrificial layer, e.g., the volume of material between the first optical element 224, and the third optical element 202 may be removed using a variety of etching methods, such as, but not limited to: a wet etch using potassium hydroxide; a gas etch using xenon diflouride; a plasma etch; a plasma assisted gas etch; and the like. After etching, the flexure 210 remains flexibly coupled between the first optical element 224 and the third optical element 202.

In certain embodiments, the third optical element 202 is movable by a coupler 238 coupled to an actuator 236 which is operatively coupled to a controller 217 through an interface 237. In other embodiments, an additional and/or other way to effect the movement of the third optical element is to electrically connect a source 216 to the first 224 and third 202 optical elements using electrical conductors 214. The source 216 is operatively coupled to a controller 217 by an interface 240. Selectively spacing the third optical element 202 from the first optical element 224 effects the wavelength of the laser light 104. The solid state optical gain medium 218 is excited (pumped) by an electrical source 222 which provides current to the optical gain medium 218 through electrical conductors 228. As previously described with regard to FIG. 3, the optical gain medium 218 of FIG. 5 need not be a solid but may include gas and/or liquid.

Figure 6:
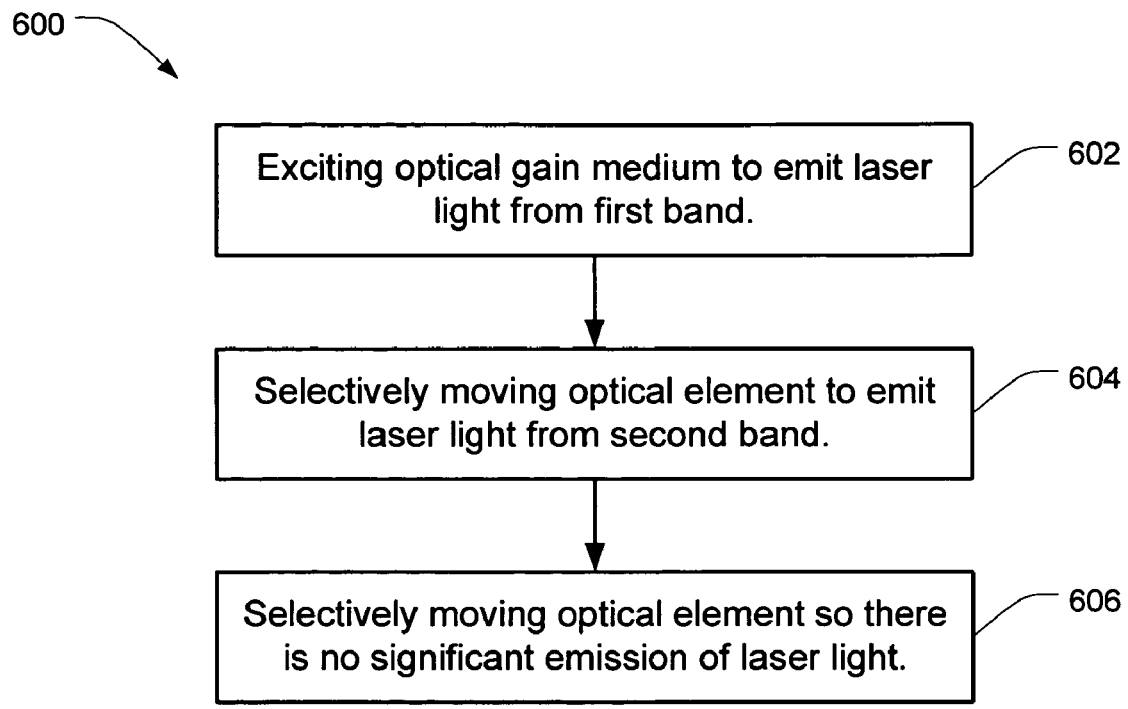
FIG. 6 shows an exemplary flow diagram with a set of acts for controlling a tunable laser according to an exemplary embodiment of an optical system.

FIG. 6 is a flow diagram of a method 600 for controlling a tunable laser according to an exemplary embodiment of an optical system. In act 602, the optical gain medium 218 is excited or pumped by an optical source 220, an electrical source 222, or both. The third optical element 202 is selectively spaced from the second optical element 206 to select a desired wavelength in a first wavelength band and the optical gain medium 218 has sufficient gain at the desired wavelength to output laser light 104 at the desired wavelength in the first band.

In act 604, the third optical element 202 is selectively spaced from the second optical element 206 to select a desired wavelength in a second band which is distinct from the first band. The optical gain medium 218 has sufficient gain at the desired wavelength to output laser light 104 at the desired wavelength in the second band as shown in FIG. 2.

In act 606, the third optical element 202 is selectively spaced from the second optical element 206 to select a desired wavelength in a third band which is distinct from the first and second bands. Although excited by source 222 and/or 220, the optical gain medium 218 does not have sufficient gain at the desired wavelength in the third band. Therefore even though the tuning of the of the third optical element 202 is selectively spaced from the second optical element, there is no lasing action and the tunable laser 102 causes no significant emission of laser light 104. Therefore, this tuning method can turn the tunable laser light 104 off by attempting to tune the wavelength into a third band which is outside of a band supported by laser cavity 235 and/or the optical gain medium 218. This tuning method can also turn the tunable laser light 104 on by tuning the wavelength inside the first and second wavelength bands which are supported by the optical gain medium 218.

These acts also apply to FIG. 4 whereby selectively spacing the third optical element 202 from the first optical element 224 results in a wavelength shift of laser light 104.

Figure 7:
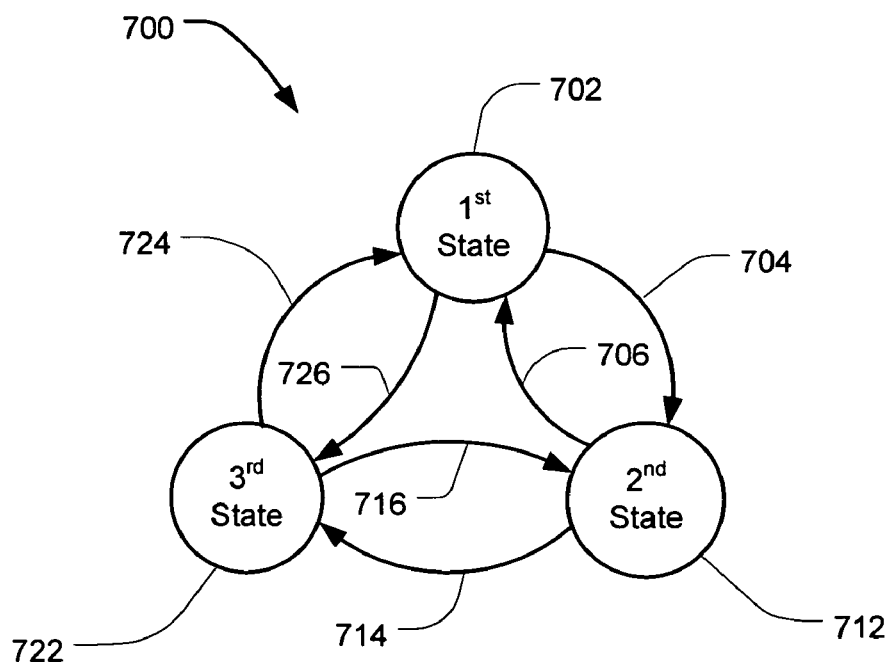
FIG. 7 shows an exemplary state diagram for controlling a tunable laser according to an exemplary embodiment of an optical system.

FIG. 7 is an exemplary state diagram 700 for controlling a tunable laser 102 according to an exemplary embodiment of an optical system. In the following states, the tunable laser 102 is continually pumped and excited. A first state 702 may be represented by tuning a tunable laser 102 within a first wavelength band. This first wavelength band may be a visible color for example, the color blue. The laser light 104 is blue because a third optical element 202 is selectively spaced apart from a second optical element 206 to render blue laser light 104 as shown in FIG. 2.

The third optical element 202 may be selectively spaced apart from the second optical element 206 to render another color, for example red laser light 104 as shown in FIG. 2. Selectively spacing the third optical element 202 from the second optical element 206 for the purpose of rendering the color red places the tunable laser 102 in a second state 712. The transition from the first state 702, in this example blue, to the second state 712, in this example red, is shown by a transition 704. The tunable laser 102 can also be commanded to transition from the second state 712, in this example red, to the first state 702, in this example blue, and is shown by the transition 706. The colors red and blue have been selected to illustrate an embodiment of an optical system; however, the choice of these colors with their corresponding optical wavelengths are not limiting. Other colors, such as for example: green, teal, orange, or the like may be chosen as laser light 104 wavelengths rendered by the laser 102 as shown in FIG. 2. A combination of visible and non-visible laser light 104 may be rendered from the laser 102 when transitioning 704 from a first state 702 to a second state 712 or when transitioning 706 from a second state 712 to a first state 702.

It is also possible to transition 726 from a first state 702 to a third state 722 or transition 714 from a second state 712 to a third state 722. In the third state, the third optical element 202 may be selectively spaced apart from the second optical element 206 to in an attempt to render a wavelength that is outside of a range where the laser cavity 235 and/or optical gain medium 218 supports lasing action and therefore no laser light 104 is output as shown in FIG. 2 By adjusting the relative displacement between the third 202 and second 206 optical elements, it is also possible to transition 724 from the third state 722 to the first state 702, in this example blue, or transition 716 from the third state 722 to the second state 712, in this example red. The transitions from the third state 722 to either the first state 702 (blue) or the second state 712 (red) turn the laser light 104 on. Transitions from the first state 702 (blue) or the second state 712 (red) to the third state 722 turn the laser light 104 off.

Therefore, by selectively positioning the third optical element 202 relative to the second optical element 206, the laser light 104 can change wavelength (e.g., to support frequency modulation), and also be turned on and off (e.g., to support amplitude modulation). Both of these features enable a wide range of applications in areas of display technology, analytical equipment, printing systems, optical communication systems, and the like.

The tunable laser 102 above has been described in reference to FIG. 2. The embodiment shown in FIG. 4, where the third optical element 202 is selectively spaced apart from the first optical element 224 can also be used to tune the laser 102' to transition between any of the first 702, second, 714 and third 722 states.

Figure 8:
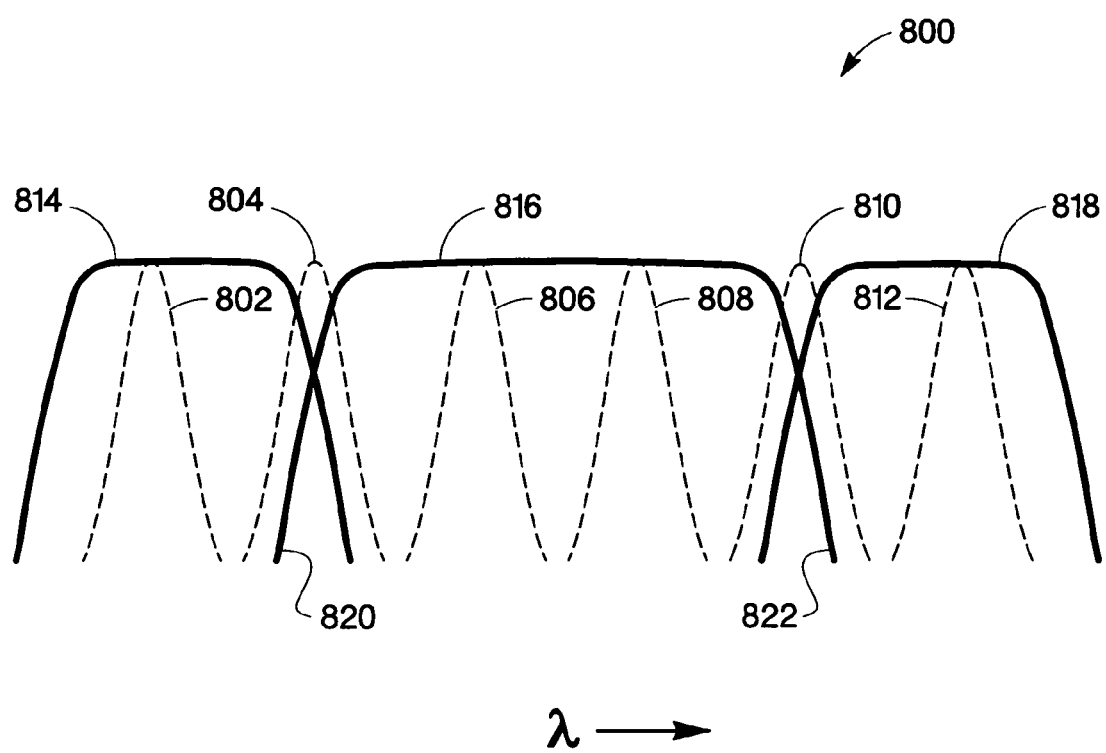
FIG. 8 shows a graph of the tunable wavelength bands of a tunable laser according to an exemplary embodiment of an optical system.

FIG. 8 shows a graph of the tunable wavelength bands of a tunable laser according to an exemplary embodiment of an optical system. By way of example, wavelength band 806 may represent the visible color blue and wavelength band 808 may represent the visible color red. Both wavelength bands are in a visible spectral band of light 816. Selectively moving the third optical element 202 relative to the second optical element 206 as shown in FIG. 2 can change the wavelength from blue 806 to red 808. The blue 806 and red 808 wavelengths correspond to the first state 702 and the second state 712 shown in FIG. 7. Both the blue 806 and red 808 wavelengths in this example produce laser light 104 from the laser 102 as shown in FIG. 2.

Selectively displacing the third optical element 202 relative to the second optical element 206 as shown in FIG. 2 can change the wavelength from red 808 to deep red 810. Continuing to displace the third optical element 202 relative to the second optical element 206 as shown in FIG. 2 can change the wavelength from deep red 810 to infrared 812. In this example, wavelength band 818 is representative of infrared light and the wavelength band 816 is representative of visible light. If the optical gain medium 218 of the laser 102 is chosen to support lasing in the visible light wavelength range 816, then tuning the laser 102 in the wavelength band 812 creates a situation where the tunable laser 102 cannot support lasing action and laser light 104 output ceases. Selectively spacing apart the third optical element 202 relative to the second optical element 206 can change the wavelength from band 812 to band 808, thereby causing the laser light 104 to resume output, for example, red. Thus, selectively spacing apart the third optical element 202 from the second optical element 206 can effect a wavelength change such that laser light 104 is turned on and off.

In a similar fashion, the third optical element 202 can be selectively spaced apart from the second optical element 206 to change the wavelength from blue 806 to deep blue 804 to ultraviolet 802. The wavelength band of 814 represents ultraviolet. If the optical gain medium 218 does not support lasing in the ultraviolet wavelength band 814, then tuning the tunable laser 102 into this range will cause the laser light 104 to cease. Tuning the tunable laser back into a range where the optical gain medium supports lasing action, for example, wavelength band 806 causes a blue laser light 104 output.

In the preceding examples, the optical gain medium 218 was assumed to support lasing action in the visible light range of wavelengths 816. However, the tunable laser 102 is not limited to visible light, the tunable laser may find application in infrared light where the tunable laser tunes laser light 104 between the wavelength bands of 810 to 812. In this example, wavelength band 812 might support lasing of a semiconductor optical gain medium 218 whereas wavelength band 810 might not support lasing of a semiconductor optical gain medium 218. So, the laser can be modulated on and off and may be used in sensitizing a photoconductive drum in a laser printer, for transmitting information in a communication system, or other applications.

The tunable laser 102 above has been described in reference to FIG. 2. The embodiment shown in FIG. 4, where the third optical element 202 is selectively spaced apart from the first optical element 224 can also be used to tune over the range of wavelengths in FIG. 8.

Examples presented herein illustrated several types of moving mechanisms including actuators 236, source 216, controller 217, coupler 238, interfaces 240 and 237 etc. Those skilled in the art will recognize other movable mechanisms may be used.

While the present embodiments of optical systems have been particularly shown and described with reference to the foregoing preferred and alternative embodiments, those skilled in the art will understand that many variations may be made therein without departing from the invention as defined in the following claims. This description of the embodiments of optical systems should be understood to include all novel and non-obvious combinations of elements described herein, and claims may be presented in this or a later application to any novel and non-obvious combination of these elements. The foregoing embodiments are illustrative, and no single feature or element is essential to all possible combinations that may be claimed in this or a later application.

What is claimed is:

1. A tunable laser comprising:
a first optical element having first and second surfaces;
a second optical element having first and second surfaces, the first surface of the second optical element facing and spaced apart from the first surface of the first optical element to form a laser cavity of fixed length there between;
an optical gain medium in at least part of the laser cavity;
a third optical element having a first surface that is parallel to, selectively spaced apart from, and facing the second surface of the second optical element; and
at least one flexure flexibly coupled between the second optical element and the third optical element;
wherein the first surface of the third optical element is configured to remain parallel to the second surface of the second optical element in response to being displaced relative to the second surface of the second optical element.

2. The tunable laser of claim 1, further comprising:
a moving mechanism configured to selectively apply a first force that displaces the third optical element relative to the second surface of the second optical element;
wherein the flexure provides a second force that opposes the first force applied by the moving mechanism.

3. The tunable laser of claim 1, wherein the optical gain medium includes at least one solid material selected from a group of solid materials comprising gallium arsenide, yttrium aluminum garnet, yttrium lithium fluoride, ruby rod and titanium doped sapphire.

4. The tunable laser of claim 1, wherein the optical gain medium includes at least one material selected from a group of materials comprising helium-neon, argon-ion, krypton-ion, xenon-ion, and helium-selenium.

5. The tunable laser of claim 1, wherein the optical gain medium includes at least one liquid selected from a group of liquids comprising stilbene, coumarin, and rhodamine.

6. The tunable laser of claim 1, further comprising:
at least one energy source operatively coupled to the optical gain medium, the energy source being selected from a group of energy sources comprising an optical source, an electrical source, and an electrical discharge energy source.

7. The tunable laser of claim 1, wherein at least one of the first, second, and third optical elements includes a material selected from a group of materials comprising tantalum and aluminum.

8. The tunable laser of claim 1, wherein at least one of the first, second, and third optical elements further includes a wavelength compensating coating thereon.

9. The tunable laser of claim 1, wherein:
the third optical element is selectively spaced apart from the second surface of the second optical element by a moving mechanism;
the first optical element is partially reflective;
the second optical element is partially reflective; and
the third optical element is at least partially reflective.

10. The tunable laser of claim 9, wherein:
the first optical element is at least about 80% reflective;
the second optical element is between about 60% to about 95% reflective; and
the third optical element is between about 60% to 100% reflective.

11. The tunable laser of claim 1, wherein;
the third optical element is selectively spaced apart from the second surface of the first optical element by a moving mechanism;
the first optical element is at least partially reflective;
the second optical element is partially reflective; and
the third optical element is partially reflective.

12. The tunable laser of claim 11, wherein;
the first optical element is between about 60% to 100% reflective;
the second optical element is between about 60% to about 95% reflective; and
the third optical element is at least about 80% reflective.

13. A multiple-state tunable laser, comprising:
at least two optical elements forming a fixed length laser cavity there between;
a movable optical element outside of the fixed length laser cavity whereby the laser is tuned;
at least one flexure flexibly coupled between the movable optical element and one of the two optical elements;
a first state where positioning the selectively movable optical element in a first position relative to and in parallel with one of the two optical elements causes the laser to lase in a first band; and
a second state where positioning the selectively movable optical element in a second position relative to and in parallel with the one of the two optical elements causes the laser to lase in a second band that is different from the first band.

14. The multiple-state laser of claim 13, wherein;
the second band does not include radiation from a visible band of radiation.

15. The multiple-state tunable laser of claim 13, further comprising:
a energy source for exciting an optical gain medium of the multiple-state tunable laser;
an moving mechanism for positioning the selectively movable optical element into a third state which causes the laser not to lase.

16. A system comprising:
a plurality of lasers each laser having:
a fixed length laser cavity, at least one moveable optical element with a first surface that is parallel to a second surface of the laser cavity, and at least one flexure flexibly coupled between the movable optical element and the second surface of the laser cavity; and
an moving mechanism operatively coupled to said at least one movable optical element and configured to selectively move the optical element in response to at least one control signal such that the first surface remains parallel to the second surface in response when the movable optical element is moved.

17. The system of claim 16, wherein said at least one movable optical element is not in the fixed length laser cavity.

18. The system of claim 16, wherein said at least one movable optical element is positioned by at least one moving mechanism selected from a group of moving mechanisms comprising an electrostatic, a piezoelectric, a thermal, a mechanical, and an electromagnetic moving mechanism.

19. The system of claim 18, wherein a controller controls the moving mechanism to position the said at least one movable optical element.

20. A method for tuning a laser, comprising:
providing a laser having a fixed cavity defined by first and second opposing surfaces and at least partially filled with an optical gain medium;
pumping the optical gain medium; and
selectively moving at least one optical element of the laser to operatively alter the function of the laser, wherein the at least one optical element is outside of the fixed cavity and has a third surface that remains in parallel with the first surface in response to being moved, and wherein a least one flexure is flexibly coupled between the second surface and the third surface.

* * * * *

UNITED STATES PATENT AND TRADEMARK OFFICE
CERTIFICATE OF CORRECTION

PATENT NO. : 7,529,280 B2
APPLICATION NO. : 11/413945
DATED : May 5, 2009
INVENTOR(S) : Conor Kelly et al.

It is certified that error appears in the above-identified patent and that said Letters Patent is hereby corrected as shown below:

In column 14, line 8, in Claim 15, delete "an" before "moving" and insert -- a --, therefor.

In column 14, line 19, in Claim 16, delete "an" before "moving" and insert -- a --, therefor.

In column 14, line 45, in Claim 20, after "wherein" delete "a" and insert -- at --, therefor.

Signed and Sealed this

Twenty-second Day of September, 2009

David J. Kappos
*Director of the United States Patent and Trademark Office*